United States Patent
Ito (10) Patent No.: US 12,261,096 B2
(45) Date of Patent: Mar. 25, 2025

(54) RADIATOR MODULE AND METHOD OF MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Shinya Ito, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 227 days.

(21) Appl. No.: 17/980,890

(22) Filed: Nov. 4, 2022

(65) Prior Publication Data
US 2023/0207423 A1  Jun. 29, 2023

(30) Foreign Application Priority Data
Dec. 28, 2021  (JP) .................................. 2021-215069

(51) Int. Cl.
*H01L 23/427*  (2006.01)
(52) U.S. Cl.
CPC .................. *H01L 23/427* (2013.01)

(58) Field of Classification Search
CPC ............................ H01L 23/427; H01L 23/492
USPC ........................................................ 361/700
See application file for complete search history.

(56) References Cited

U.S. PATENT DOCUMENTS

2013/0269913 A1* 10/2013 Ueda .................. F28D 15/0233
165/104.26

FOREIGN PATENT DOCUMENTS

| JP | S47-036973 A | 11/1972 |
| JP | 2001-339026 A | 12/2001 |
| JP | 2009-266941 A | 11/2009 |
| JP | 2013-044459 A | 3/2013 |
| JP | 2016-035945 A | 3/2016 |

\* cited by examiner

*Primary Examiner* — Timothy J Thompson
*Assistant Examiner* — Guillermo J Egoavil
(74) *Attorney, Agent, or Firm* — Posz Law Group, PLC

(57) ABSTRACT

A radiator module includes a heat pipe and a terminal. The heat pipe includes a first plate and a second plate between which a refrigerant channel is defined, and a support member extending from the first plate to the second plate. The terminal is joined to a connection body of the first plate and the support member from outside of the heat pipe. The support member is located within a range that overlaps a joint portion of the terminal and the connection body when viewed in a thickness direction of the first plate.

10 Claims, 6 Drawing Sheets

RADIATOR MODULE AND METHOD OF MANUFACTURING THE SAME

CROSS REFERENCE TO RELATED APPLICATION

This application is based on Japanese Patent Application No. 2021-215069 filed on Dec. 28, 2021, the disclosure of which is incorporated herein by reference.

TECHNICAL FIELD

The present disclosure relates to a radiator module and a method of manufacturing the radiator module.

BACKGROUND ART

A flat heat pipe can efficiently cool a semiconductor chip.

SUMMARY

According to an aspect of the present disclosure, a radiator module has a heat pipe and a terminal. The heat pipe has a first plate, a second plate opposing the first plate through a refrigerant channel, and a support member extending from the first plate to the second plate. The terminal is joined to a connection body of the first plate and the support member from outside of the heat pipe. When viewed in the thickness direction of the first plate, the support member is positioned within a range overlapping a joint portion of the terminal and the connection body.

DETAILED DESCRIPTION

To begin with, examples of relevant techniques will be described. A flat heat pipe can efficiently cool a semiconductor chip.

When using a heat pipe as a current path, a terminal may be joined to the heat pipe. When joining the terminal to the heat pipe, the terminal is pressed against the heat pipe. Since the heat pipe includes a refrigerant channel, when the terminal is pressurized onto the heat pipe, a plate material forming the outer wall of the heat pipe bends. When the plate material bends, a gap is generated between the terminal and the plate material, and the terminal may not be properly joined to the plate material. This specification proposes a technique for suitably joining a terminal to a heat pipe.

According to an aspect of the present disclosure, a radiator module has a heat pipe and a terminal. The heat pipe has a first plate, a second plate opposing the first plate through a refrigerant channel, and a support member extending from the first plate to the second plate. The terminal is joined to a connection body of the first plate and the support member from outside of the heat pipe. When viewed in the thickness direction of the first plate, the support member is positioned within a range overlapping a joint portion of the terminal and the connection body.

The above description that "the terminal is joined to the connection body of the first plate and the support member from outside of the heat pipe" means that the terminal is joined to at least one of the first plate and the support member from outside of the heat pipe. That is, the terminal may be joined to the first plate or the support member, or may be joined to both the first plate and the support member.

In this specification, the heat pipe includes a vapor chamber.

Accordingly, the terminal is joined to the connection body so that the support member is arranged within a range overlapping the joint portion when viewed in the thickness direction of the first plate. Therefore, when the terminal is joined to the connection body (that is, when the terminal is pressed onto the connection body), the pressure is received by the support member. Therefore, bending of the connection body is suppressed, and appropriate pressure is applied to the joint portion. Therefore, the terminal can be suitably joined to the connection body.

According to an aspect of the present disclosure, a method for manufacturing a radiator module includes a step of joining the terminal to the heat pipe. The heat pipe has a first plate, a second plate opposing the first plate through a refrigerant channel, and a support member extending from the first plate to the second plate. In the step of joining the terminal to the heat pipe, the terminal is joined to the connection body of the first plate and the support member from outside of the heat pipe. In the step of joining the terminal to the heat pipe, the terminal is joined to the connection body such that the support member is arranged within a range overlapping the joint portion of the terminal and the connection body when viewed in the thickness direction of the first plate.

According to this manufacturing method, the terminal can be suitably joined to the connection body.

According to an aspect of the present disclosure, a radiator module has a support member that is arranged within a refrigerant channel. In this case, the heat pipe may have an injection passage that extends from the first plate to the support member and communicates with the refrigerant channel. The injection passage may be sealed by a sealing member in the first plate. The terminal may be arranged to cover the sealing member.

According to this configuration, when the terminal is joined to the connection body, the joint portion can be supported by the support member arranged in the refrigerant channel.

According to an aspect of the present disclosure, the support member may be a side wall forming a side surface of the refrigerant channel. According to this configuration, when the terminal is joined to the connection body, the joint portion can be supported by the side wall.

According to an aspect of the present disclosure, when viewed in the thickness direction of the first plate, the area of the overlapping portion where the joint portion and the support member overlap is more than or equal to 20% of the area of the joint portion.

According to this configuration, since the support member is less likely to deform, the support member can more effectively suppress bending of the joint portion when the terminal is joined to the connection body.

According to an aspect of the present disclosure, the terminal may be joined to the first plate from outside of the heat pipe.

According to an aspect of the present disclosure, the support member may be fixed to the first plate by caulking, press-fitting, or bonding.

Figure 1:
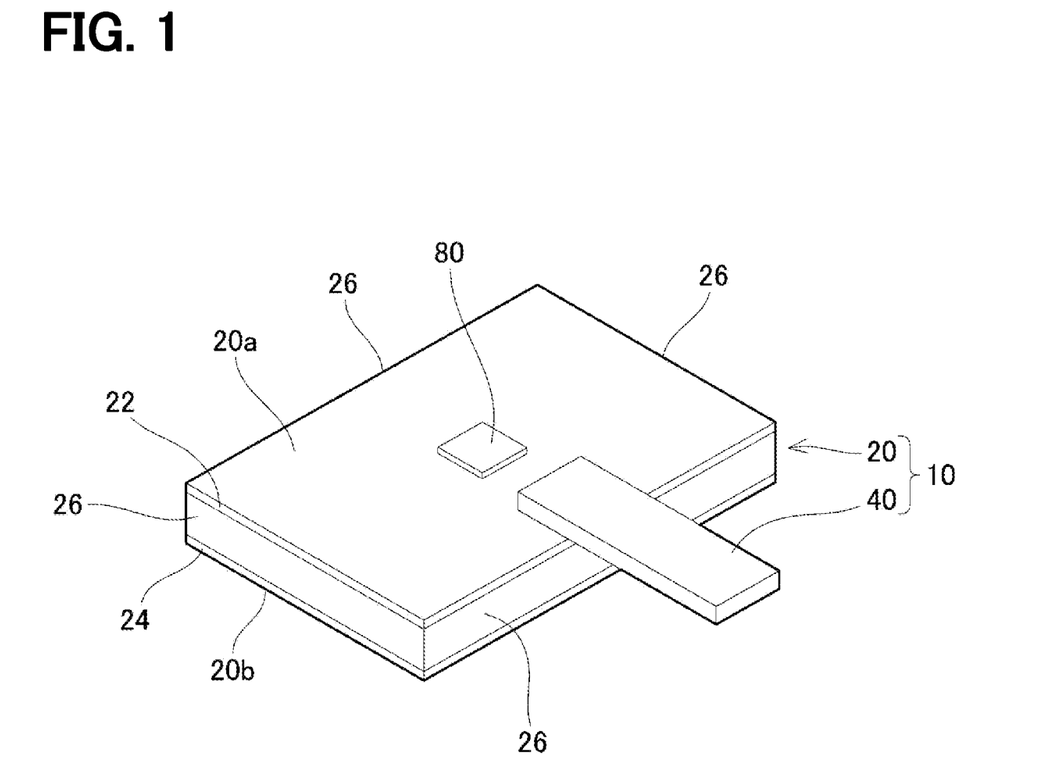
FIG. 1 is a perspective view illustrating a radiator module according to a first embodiment.

FIG. 1 shows a radiator module 10 for cooling a semiconductor chip 80. The radiator module 10 has a heat pipe 20 and a bus bar 40. The heat pipe 20 has a flat box shape, and includes a refrigerant channel through which a refrigerant circulates. The heat pipe 20 has an upper plate 22, a lower plate 24 and four side walls 26. The upper plate 22 is a metal plate forming the upper surface 20a of the heat pipe 20. The lower plate 24 is a metal plate forming the lower surface 20b of the heat pipe 20. Each of the side walls 26 is a metal plate forming each side of the heat pipe 20. A space surrounded by the upper plate 22, the lower plate 24, and the four side walls 26 is the refrigerant channel. A refrigerant (so-called working fluid) is enclosed in the refrigerant channel. The bus bar 40 is a metal plate and is joined to the upper surface 20a of the heat pipe 20. The bus bar 40 extends outward from the heat pipe 20. The heat pipe 20 and the bus bar 40 are made of copper, for example. The semiconductor chip 80 is mounted on the upper surface 20a of the heat pipe 20. The heat pipe 20 functions as a heat dissipation member that cools the semiconductor chip 80. The heat pipe 20 is electrically connected to the semiconductor chip 80. That is, the bus bar 40 is electrically connected to the semiconductor chip 80 via the heat pipe 20. The bus bar 40 is a terminal for applying current to the semiconductor chip 80. Although not shown, a wiring member is connected to the semiconductor chip 80 in addition to the heat pipe. Embodiments of the connection structure between the bus bar 40 and the heat pipe 20 will be described below.

First Embodiment

Figure 2:
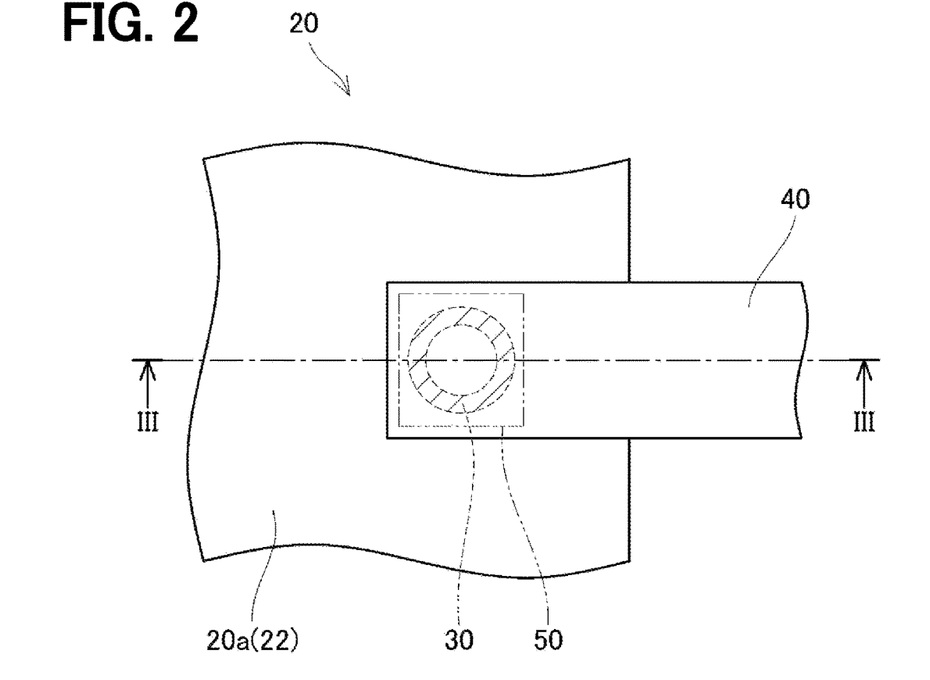
FIG. 2 is a plan view illustrating a connection structure of the first embodiment.
Figure 3:
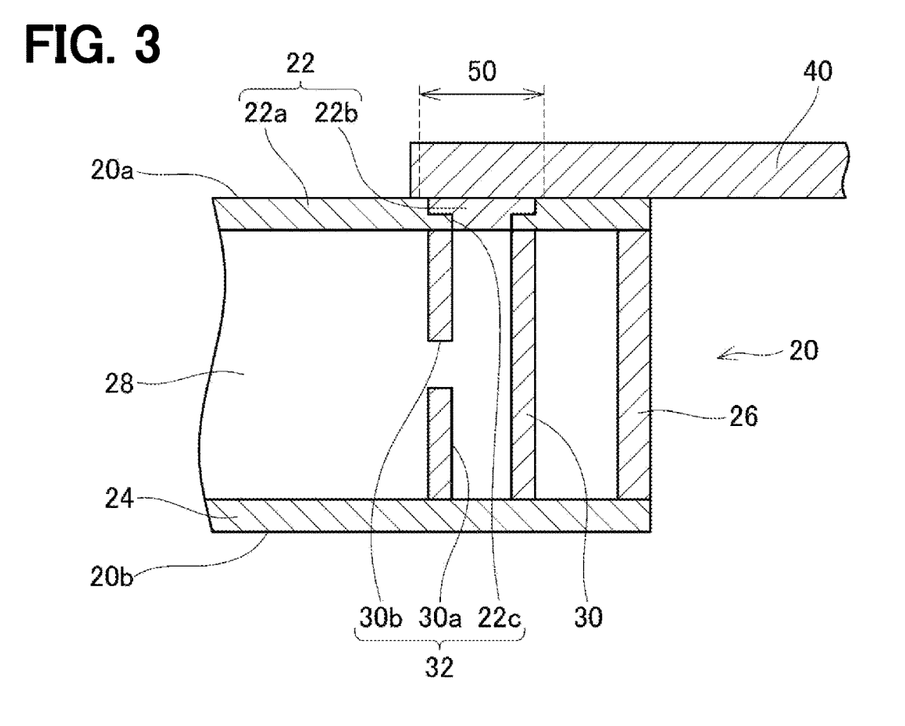
FIG. 3 is a cross-sectional view of the connection structure of the first embodiment.

FIGS. 2 and 3 show the connection structure of the first embodiment. As shown in FIG. 3, a refrigerant channel 28 is formed between the upper plate 22 and the lower plate 24. That is, the lower plate 24 opposes the upper plate 22 with the refrigerant channel 28 interposed therebetween. A refrigerant is enclosed in the refrigerant channel 28. Although not shown, a wick is arranged in the refrigerant channel 28 for moving the liquid refrigerant by capillary action. The refrigerant in the refrigerant channel 28 evaporates by being heated under the semiconductor chip 80. The evaporated refrigerant flows to the outer periphery of the heat pipe 20, and is cooled and condensed at the outer periphery. The condensed refrigerant flows along the wick to the center portion of the heat pipe 20 (that is, under the semiconductor chip 80). The semiconductor chip 80 is cooled by circulating the refrigerant in the refrigerant channel 28 in this way.

The upper plate 22 has a plate member 22a and a sealing member 22b. The plate member 22a constitutes a main portion of the upper plate 22. A through hole 22c is provided in the plate member 22a. The sealing member 22b closes the through hole 22c.

The heat pipe 20 includes a support member 30 positioned within the refrigerant channel 28. The support member 30 has a cylindrical shape extending in the thickness direction of the heat pipe 20. The support member 30 extends from the upper plate 22 to the lower plate 24. The upper end of the support member 30 is joined to the lower surface of the plate member 22a, and the lower end of the support member 30 is joined to the upper surface of the lower plate 24. In the manufacturing process of the heat pipe 20, the support member 30 is bonded to the plate member 22a and the lower plate 24 by metal diffusion bonding, ultrasonic bonding, normal temperature diffusion bonding, or the like. A center hole 30a of the support member 30 is connected to the through hole 22c provided in the plate member 22a. In other words, when viewed in the thickness direction of the upper plate 22, the through hole 22c is provided within a range surrounded by the support member 30. A through hole 30b is formed in the side surface of the support member 30. The through hole 30b penetrates the outer peripheral wall of the support member 30. The through hole 22c, the center hole 30a, and the through hole 30b form an injection passage 32 that extends from the upper surface of the upper plate 22 into the support member 30 and opens to the refrigerant channel 28. In the manufacturing process of the heat pipe 20, the refrigerant is injected into the refrigerant channel 28 through the injection passage 32, and then the through hole 22c is sealed by the sealing member 22b.

The bus bar 40 is arranged on the upper plate 22 at a position above the support member 30. The lower surface of the bus bar 40 is joined to the upper surface of the upper plate 22 within a joint portion 50. As shown in FIG. 2, the support member 30 is arranged at a position overlapping the joint portion 50 when viewed along the thickness direction of the upper plate 22. In the first embodiment, as shown in FIG. 2, the entire support member 30 is included in the joint portion 50 when viewed along the thickness direction of the upper plate 22. That is, as shown in FIG. 3, the support member 30 extends from the upper plate 22 to the lower plate 24 within a range overlapping the joint portion 50. The bus bar 40 is arranged to cover the sealing member 22b. The bus bar 40 is joined to the sealing member 22b and joined to the plate member 22a around the sealing member 22b. As shown in FIG. 2, when viewed along the thickness direction of the upper plate 22, the area of the overlapping portion (that is, the hatched portion in FIG. 2) where the joint portion 50 and the support member 30 overlap is more than or equal to 20% of the area of the joint portion 50.

Figure 4:
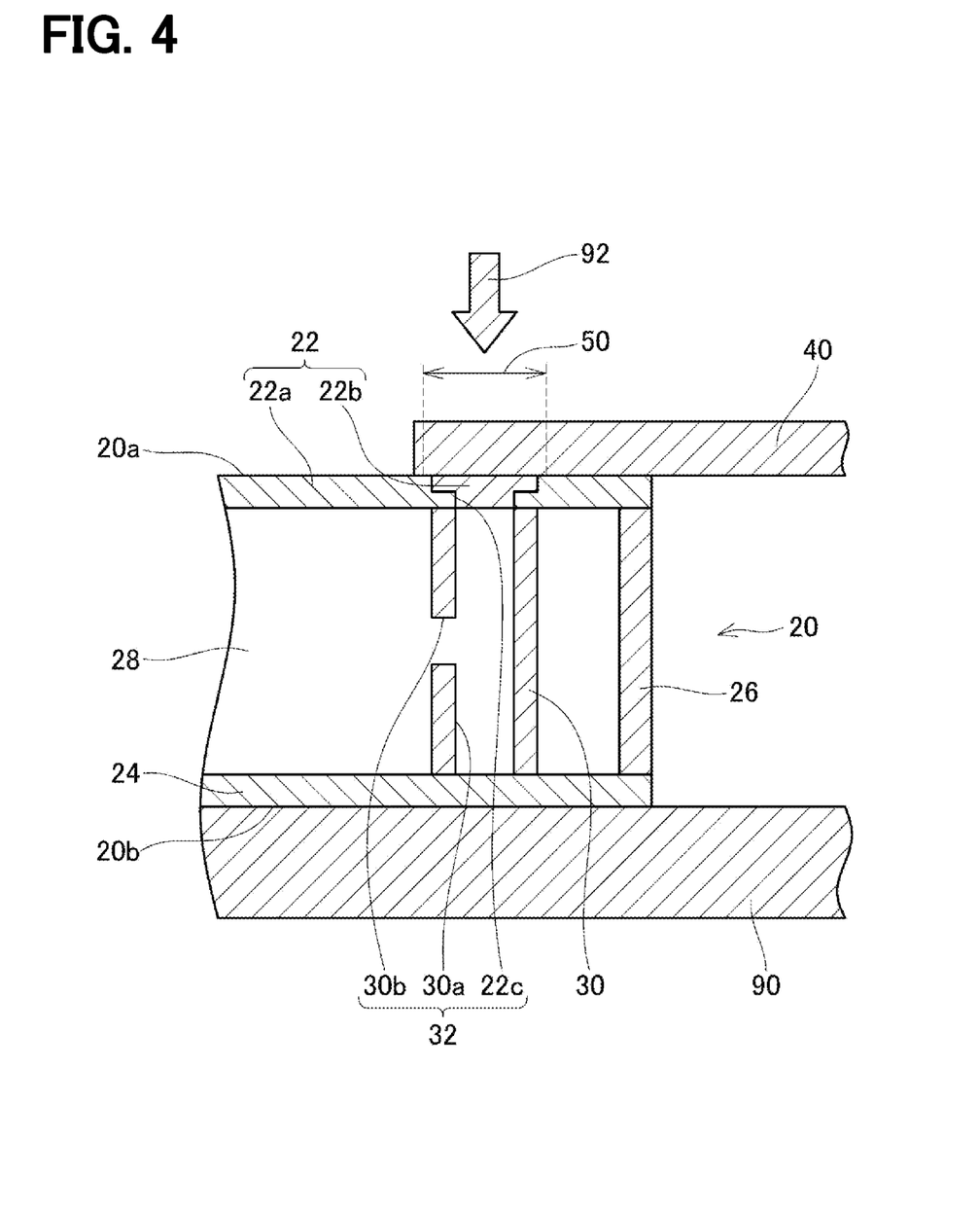
FIG. 4 is an explanatory diagram of the connection process of the first embodiment.

FIG. 4 shows a joining step for joining the bus bar 40 to the upper plate 22 when manufacturing the radiator module of the first embodiment. In the joining step, the bus bar 40 is joined to the upper plate 22 by ultrasonic bonding. In the joining step, first, the heat pipe 20 is placed on the stage 90 so that the lower surface 20b of the heat pipe 20 is in contact with the stage 90. The bus bar 40 is arranged on the upper plate 22 so that the bus bar 40 overlaps the upper plate 22 above the support member 30. Next, as indicated by an arrow 92 in FIG. 4, while pressing the bus bar 40 onto the upper plate 22 above the support member 30, ultrasonic waves are applied to the bus bar 40 at the pressurized portion. As a result, the bus bar 40 is joined to the upper plate 22 at the position above the support member 30. More specifically, the bus bar 40 is joined to the plate member 22a and the sealing member 22b at a position above the support member 30. As a result, the joint portion 50 is formed at the position above the support member 30.

When the bus bar 40 is pressed against the upper plate 22 in the joining step, if the upper plate 22 is bent by the pressure, a gap is formed between the bus bar 40 and the upper plate 22. If such a gap occurs, the bus bar 40 may not be joined to the upper plate 22 or the joint strength between the bus bar 40 and the upper plate 22 may be weakened. According to the joining step of the first embodiment, the bus bar 40 is pressed against the upper plate 22 above the support member 30. Since the support member 30 extends from the upper plate 22 to the lower plate 24, the support member 30 supports the upper plate 22 from the lower side during the joining step. This suppresses bending of the upper plate 22 when pressure is applied to the upper plate 22. The area of the overlapping portion (the hatched portion in FIG. 2) where the joint portion 50 and the support member 30 overlap is more than or equal to 20% of the area of the joint portion 50. Therefore, the support member 30 is difficult to deform while the pressure is applied, and the upper plate 22 can be more effectively suppressed from bending. As a result, a gap is restricted from occurring between the bus bar 40 and the upper plate 22, and the bus bar 40 is properly joined to the upper plate 22.

As described above, in the radiator module having the connection structure of the first embodiment, the bus bar 40 is properly joined to the upper plate 22. Therefore, the joint portion 50 between the bus bar 40 and the upper plate 22 has high strength.

Although the bus bar 40 is joined to both the plate member 22a and the sealing member 22b in the first embodiment, the bus bar 40 may be joined to the plate member 22a and may not be joined to the sealing member 22b. Further, when the sealing member 22b is firmly fixed to the plate member 22a, the bus bar 40 may be joined to the sealing member 22b and not joined to the plate member 22a.

Second Embodiment

Figure 5:
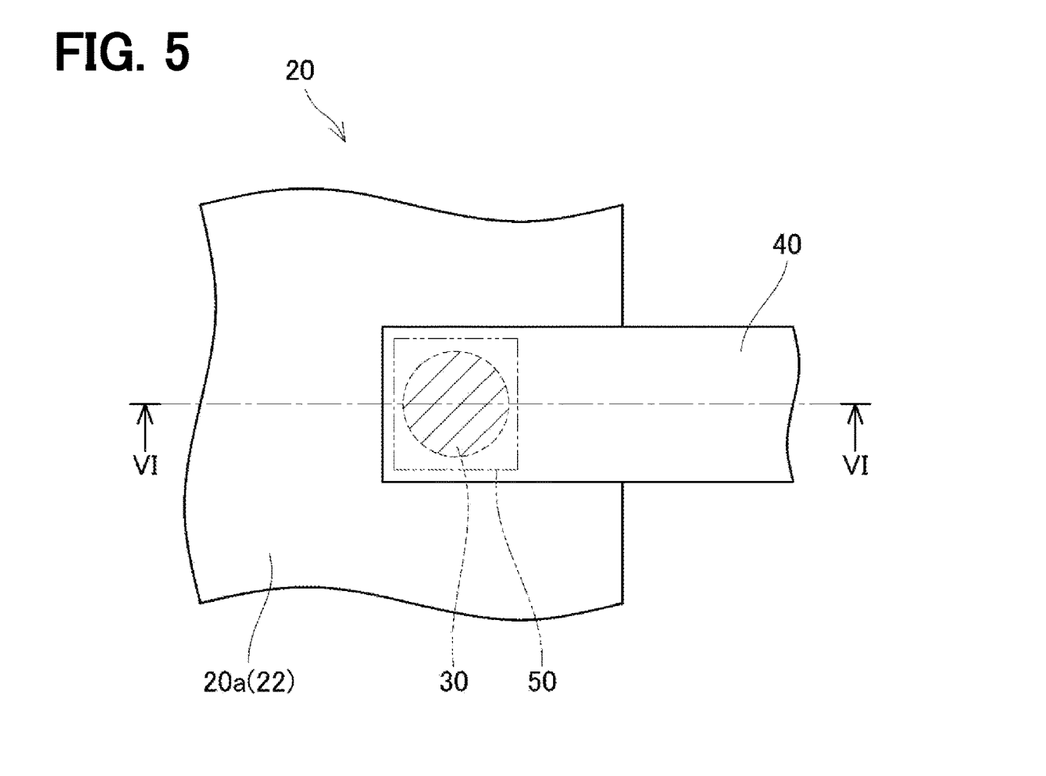
FIG. 5 is a plan view illustrating a connection structure according to a second embodiment.
Figure 6:
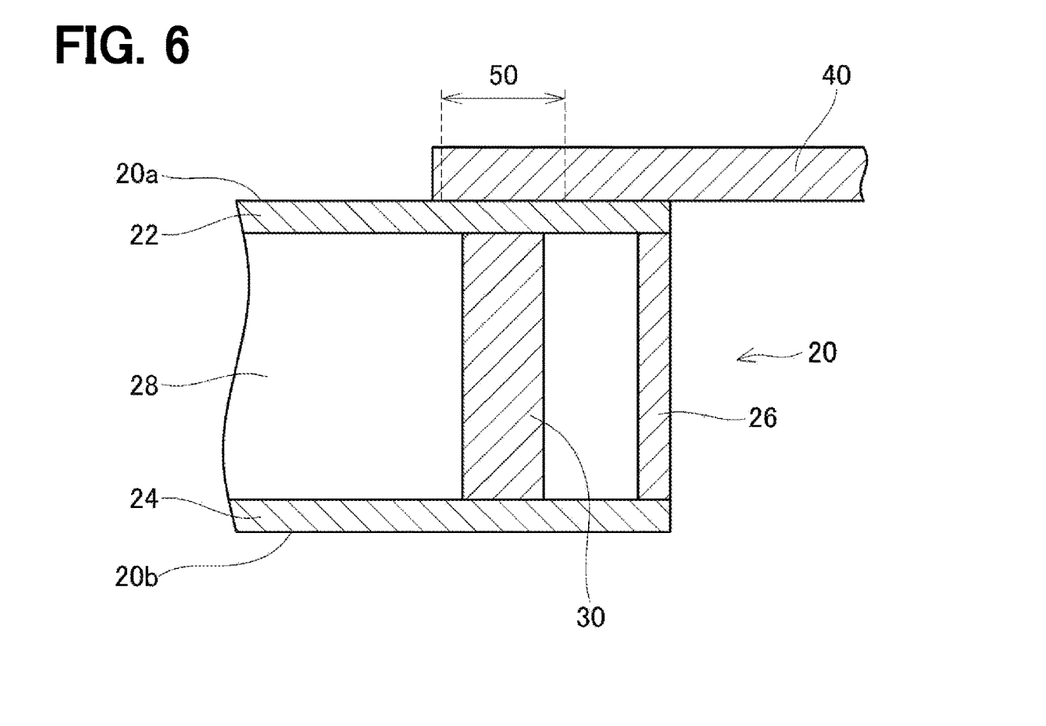
FIG. 6 is a cross-sectional view of the connection structure of the second embodiment.

FIGS. 5 and 6 show a connection structure of the second embodiment. In the second embodiment, the injection passage 32 is not provided within a range overlapping the joint portion 50. That is, in the second embodiment, the upper plate 22 does not have the through hole 22c within the range overlapping the joint portion 50, and the support member 30 does not have the center hole 30a and the through hole 30b. Therefore, the support member 30 of the second embodiment is a dedicated member for supporting the upper plate 22 in the joining step, and does not have the injection passage 32. Other configurations of the connection structure of the second embodiment are the same as those of the first embodiment.

In the joining step of the second embodiment, as in the first embodiment, the heat pipe 20 is placed on the stage so that the lower surface 20b is in contact with the stage. Moreover, the bus bar 40 is pressed onto the upper plate 22 at the upper position of the support member 30, and ultrasonic waves are applied to the pressurized portion. As a result, the bus bar 40 is joined to the upper plate 22 at the upper position of the support member 30, and the joint portion 50 is formed at the upper position of the support member 30. Since the upper plate 22 is supported by the support member 30 when the bus bar 40 is pressed against the upper plate 22, bending of the upper plate 22 is suppressed. Since the area of the overlapping portion (that is, the hatched portion in FIG. 5) where the joint portion 50 and the support member 30 overlap is more than or equal to 20% of the area of the joint portion 50, the support member 30 has high strength. The support member 30 is less likely to deform when the pressure is applied. Therefore, the bending of the upper plate 22 is more effectively suppressed by the support member 30. Therefore, the bus bar 40 is properly joined to the upper plate 22.

As described above, the bus bar 40 is appropriately joined to the upper plate 22 also in the radiator module having the connection structure of the second embodiment. Therefore, the joint portion 50 between the bus bar 40 and the upper plate 22 has high strength.

Figure 7:
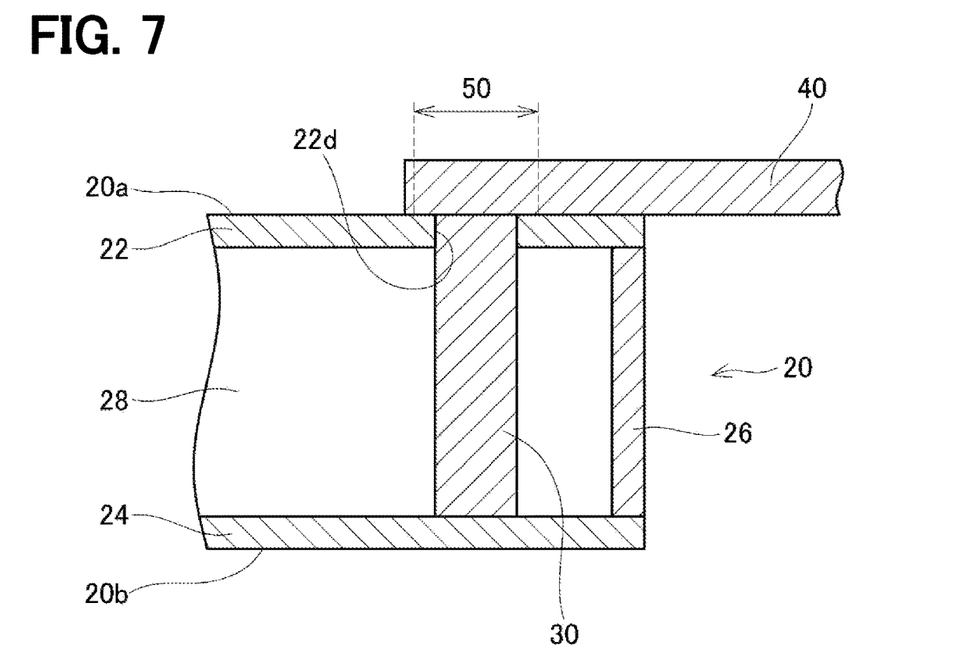
FIG. 7 is a plan view of a connection structure according to a first modification of the second embodiment.
Figure 8:
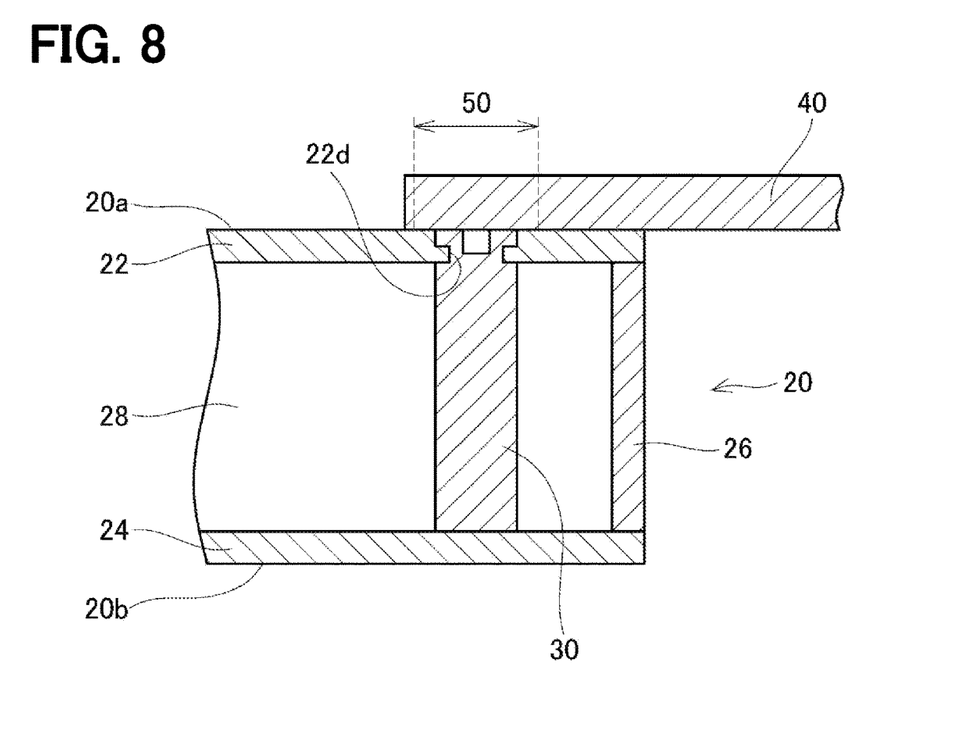
FIG. 8 is a plan view of a connection structure according to a second modification of the second embodiment.

In the second embodiment, the upper end of the support member 30 is joined to the lower surface of the upper plate 22. However, as shown in FIG. 7, the support member 30 may be fixed to the upper plate 22 by press-fitting the upper end of the support member 30 into a fixing hole 22d provided in the upper plate 22. Alternatively, as shown in FIG. 8, the upper end of the support member 30 may be fixed to the fixing hole 22d by caulking. In FIG. 7 or 8, the bus bar 40 may be joined to both the upper plate 22 and the support member 30, or the bus bar 40 may be joined to the upper plate 22 and not joined to the support member 30. Moreover, when the connection strength between the support member 30 and the upper plate 22 is high, the bus bar 40 may be joined to the support member 30 and not joined to the upper plate 22. In this way, when the upper plate 22 and the support member 30 are exposed from the surface of the heat pipe 20, the bus bar 40 can be joined to the connection body of the upper plate 22 and the support member 30. Also, the fixing structure (that is, press fitting or caulking) of the support member 30 and the upper plate 22 shown in FIG. 7 or 8 may be applied to the first embodiment (that is, FIG. 3).

In the first embodiment and the second embodiment, the support member 30 extends from the upper plate 22 to the lower plate 24 within a range overlapping the joint portion 50. According to such a configuration, the upper plate 22 inside the joint portion 50 can be favorably supported by the support member 30 in the joining step. However, in some cases, the upper end of the support member 30 may be arranged within a range that overlaps the joint portion 50, and the other portion (for example, the lower end) of the support member 30 may be arranged within a range that does not overlap with the joint portion 50.

Third Embodiment

Figure 9:
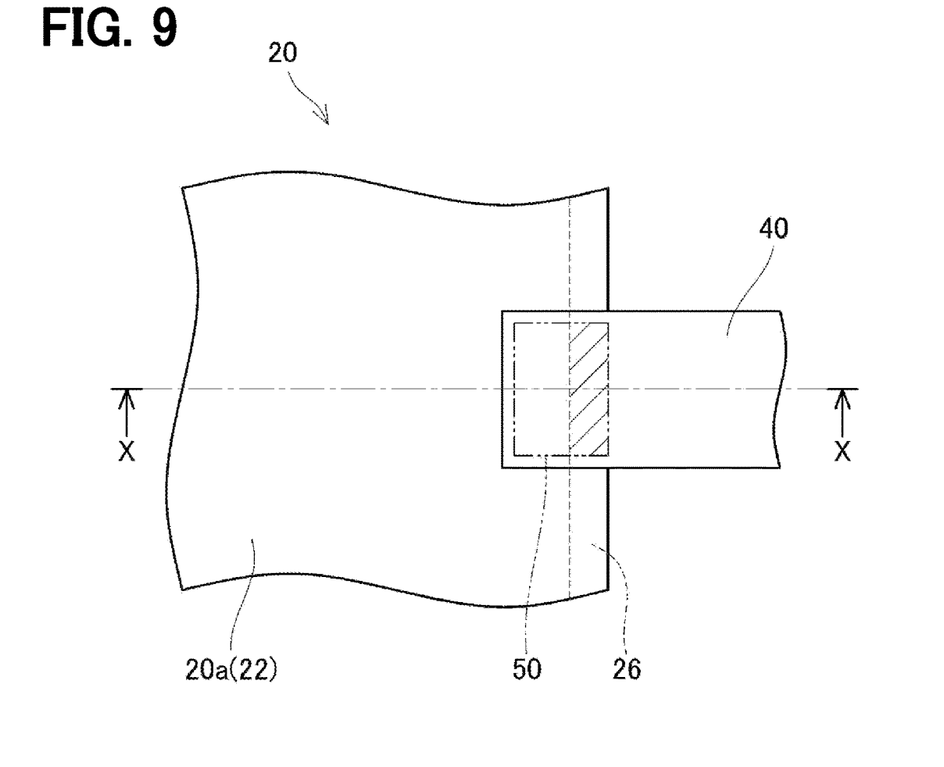
FIG. 9 is a plan view illustrating a connection structure according to a third embodiment.
Figure 10:
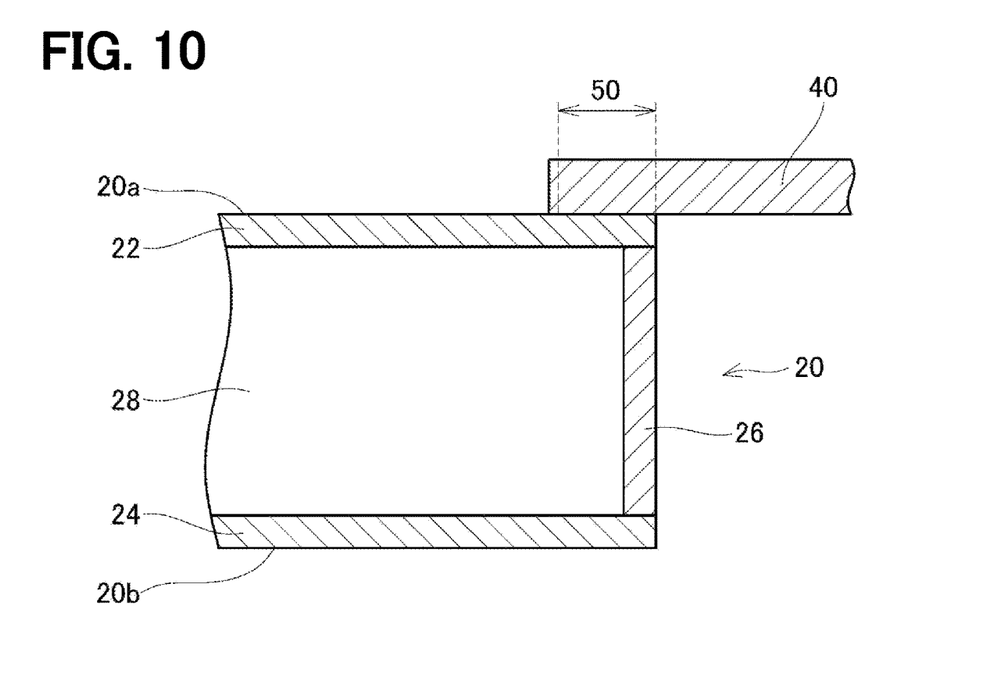
FIG. 10 is a cross-sectional view of the connection structure of the third embodiment.

FIGS. 9 and 10 show a connection structure of the third embodiment. In the third embodiment, the bus bar 40 is joined to the upper plate 22 at the upper position of the side wall 26. That is, in the third embodiment, the side wall 26 serves as a support member. The side wall 26 extends from the upper plate 22 to the lower plate 24 within a range overlapping the joint portion 50. Other configurations of the connection structure of the third embodiment are the same as those of the first embodiment.

In the joining step of the third embodiment, as in the first embodiment, the heat pipe 20 is placed on the stage so that the lower surface 20b is in contact with the stage. Also, the bus bar 40 is pressed onto the upper plate 22 at the upper position of the side wall 26, and ultrasonic waves are applied to the pressed portion. As a result, the bus bar 40 is joined to the upper plate 22 at the upper position of the side wall 26 and the joint portion 50 is formed at the upper position of the side wall 26. Since the upper plate 22 is supported by the side wall 26 when the bus bar 40 is pressed onto the upper plate 22, the bending of the upper plate 22 is suppressed. Since the area of the overlapping portion (that is, the hatched portion in FIG. 9) where the joint portion 50 and the side wall 26 overlap is more than or equal to 20% of the area of the joint portion 50, the side wall 26 has high strength and the side wall 26 is difficult to deform. Therefore, bending of the upper plate 22 is suppressed more effectively. Therefore, the bus bar 40 is properly joined to the upper plate 22.

As described above, the bus bar 40 is appropriately joined to the upper plate 22 also in the radiator module having the connection structure of the third embodiment. Therefore, the joint portion 50 between the bus bar 40 and the upper plate 22 has high strength.

Although the upper end of the side wall 26 is joined to the lower surface of the upper plate 22 in the third embodiment, the upper plate 22 and the side wall 26 may be formed of a single L-shaped bent plate material.

The upper plate of each of the embodiments is an example of a first plate. The lower plate of each of the embodiments is an example of a second plate. A bus bar of each of the embodiments is an example of a terminal. The support member 30 of each of the first embodiment and the second embodiment and the side wall 26 of the third embodiment are examples of a support member.

Although the embodiments have been described in detail above, these are merely examples and do not limit the scope of claims. The techniques described in claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve plural objectives at the same time, and the achieving one of the objectives has technical usefulness.

What is claimed is:

1. A radiator module comprising:
   a heat pipe including a first plate, a second plate opposing the first plate through a refrigerant channel, and a support member extending from the first plate to the second plate; and
   a terminal joined to a connection body of the first plate and the support member from outside of the heat pipe, wherein
   the support member is located within a range that overlaps a joint portion of the terminal and the connection body when viewed in a thickness direction of the first plate,
   the support member is arranged within the refrigerant channel,
   the heat pipe includes an injection passage extending from the first plate to the support member so as to open to the refrigerant channel,
   the injection passage is sealed by a sealing member in the first plate, and
   the terminal is arranged to cover the sealing member.

2. The radiator module according to claim 1, wherein the support member is a side wall forming a side surface of the refrigerant channel.

3. The radiator module according to claim 1, wherein when viewed in the thickness direction of the first plate, an area of an overlapping portion where the joint portion and the support member overlap with each other is 20% or more of an area of the joint portion.

4. The radiator module according to claim 1, wherein the terminal is joined to the first plate from outside of the heat pipe.

5. The radiator module according to claim 1, wherein the support member is fixed to the first plate by caulking, press-fitting, or bonding.

6. A method of manufacturing a radiator module having a heat pipe including a first plate, a second plate opposing the first plate through a refrigerant channel, and a support member extending from the first plate to the second plate, and a terminal joined to a connection body of the first plate and the support member from outside of the heat pipe, wherein the support member is located within a range that overlaps a joint portion of the terminal and the connection body when viewed in a thickness direction of the first plate, the method comprising:
   joining the terminal to the heat pipe,
   arranging the support member within the refrigerant channel,
   sealing an injection passage of the heat pipe with a sealing member in the first plate, and
   covering the sealing member with the terminal in the joining,
   wherein the joining includes
      connecting the terminal to the connection body of the first plate and the support member from outside of the heat pipe, and
      placing the support member within the range that overlaps the joint portion of the terminal and the connection body when viewed in the thickness direction of the first plate.

7. The method according to claim 6, wherein the support member is a side wall forming a side surface of the refrigerant channel.

8. The method according to claim 6, wherein
   in the joining, an area of an overlapping portion where the joint portion and the support member overlap with each other is more than or equal to 20% of an area of the joint portion, when viewed in the thickness direction of the first plate.

9. The method according to claim 6, wherein
   in the joining, the terminal is joined to the first plate from the outside of the heat pipe.

10. The method according to claim 6, wherein
    in the joining, the support member is fixed to the first plate by caulking, press-fitting, or bonding.

* * * * *